(12) United States Patent
Nishimura

(10) Patent No.: US 7,985,699 B2
(45) Date of Patent: Jul. 26, 2011

(54) SUBSTRATE PROCESSING METHOD AND STORAGE MEDIUM

(75) Inventor: Eiichi Nishimura, Narasaki (JP)

(73) Assignee: Tokyo Electron Limited, Tokyo (JP)

( * ) Notice: Subject to any disclaimer, the term of this patent is extended or adjusted under 35 U.S.C. 154(b) by 753 days.

(21) Appl. No.: 11/689,272

(22) Filed: Mar. 21, 2007

(65) Prior Publication Data

US 2007/0224818 A1 Sep. 27, 2007

Related U.S. Application Data

(60) Provisional application No. 60/788,103, filed on Apr. 3, 2006.

(30) Foreign Application Priority Data

Mar. 22, 2006 (JP) ................................. 2006-079640

(51) Int. Cl.
*H01L 21/469* (2006.01)

(52) U.S. Cl. ........ 438/781; 438/700; 438/709; 438/725; 257/E21.218; 257/E21.254; 257/E21.492

(58) Field of Classification Search .................. 438/707, 438/709; 257/E21.254, E21.487, E21.492
See application file for complete search history.

(56) References Cited

U.S. PATENT DOCUMENTS

| | | | |
|---|---|---|---|
| 5,201,987 A | 4/1993 | Hawkins et al. | |
| 7,056,831 B2 | 6/2006 | Iwai et al. | |
| 2002/0006876 A1* | 1/2002 | Hongo et al. | 505/191 |
| 2004/0224243 A1* | 11/2004 | Yoshizawa et al. | 430/5 |
| 2004/0260420 A1 | 12/2004 | Ohno et al. | |
| 2005/0247404 A1 | 11/2005 | Iwai et al. | |
| 2006/0048886 A1* | 3/2006 | Kakuta et al. | 156/233 |
| 2006/0170111 A1* | 8/2006 | Isa et al. | 257/775 |
| 2006/0279676 A1* | 12/2006 | Masutani et al. | 349/114 |

FOREIGN PATENT DOCUMENTS

| | | |
|---|---|---|
| CN | 1669109 A | 9/2005 |
| JP | 58-159332 | 9/1983 |
| JP | 61-191035 | 8/1986 |
| JP | 2001-060618 | 3/2001 |
| JP | 2005-347620 | 12/2005 |
| KR | 10-2004-0111190 | 12/2004 |
| KR | 10-2005-0032837 | 4/2005 |

OTHER PUBLICATIONS

Office Action issued Aug. 10, 2010, in Chinese Patent Application No. 200710089424.X, filed Mar. 22, 2007 (with English language translation).

Office Action issued Jan. 5, 2011, in Japanese Patent Application No. 2006-079640 (with English translation). 6 pages.

* cited by examiner

*Primary Examiner* — Cheung Lee

(74) *Attorney, Agent, or Firm* — Oblon, Spivak, McClelland Maier & Neustadt, L.L.P.

(57) ABSTRACT

A substrate processing method capable of preventing a substrate rear surface from being scratched when attracted onto an electrostatic chuck. In a coater/developer (11), a photocurable resin is coated onto a rear surface of a wafer (W), the resin is cured to form a resin protective film, and a resist is coated onto a front surface of the wafer. An exposing apparatus (12) subjects the resist to light exposure processing, irradiating ultraviolet light onto a resist portion of a pattern reversed with respect to a mask pattern. The coater/developer uses a washing liquid to remove the resist, thereby forming a resist film. In an etching apparatus (13), the front surface of the wafer is electrostatically attracted onto an electrostatic chuck (49) is subjected to RIE processing. In a washing apparatus (14), the resin protective film is dissolved and removed.

12 Claims, 9 Drawing Sheets

SUBSTRATE PROCESSING METHOD AND STORAGE MEDIUM

BACKGROUND OF THE INVENTION

1. Field of the Invention

The present invention relates to a substrate processing method, and a storage medium in which is computer-readably stored a program for causing a computer to implement the method, and in particular relates to such a substrate processing method and storage medium for a substrate processing system having an etching apparatus having therein an electrostatic chuck that electrostatically attracts a substrate.

2. Description of the Related Art

A substrate processing system for forming wiring grooves or via holes in a desired pattern using plasma on a front surface of a wafer as a substrate is comprised of a coater that coats a positive type resist onto the front surface of the wafer, an exposing apparatus that subjects a portion of the resist, which has been cured by heating or the like, to light exposure, a developer that uses a developing liquid to remove, from the front surface of the wafer, the resist that has been subjected to the light exposure, thus forming a resist film, an etching apparatus that subjects the front surface of the wafer to etching processing, for example RIE (reactive ion etching) processing, and a washing apparatus that removes the resist film. In recent years, it has become that in such a substrate processing system, from the viewpoint of saving space, the coater and the developer are often integrated together.

The etching apparatus has a housing chamber that houses the wafer and in which plasma is produced, and an electrostatic chuck that is disposed in the housing chamber and electrostatically attracts the wafer thereto while the wafer is being subjected to the etching processing (see, for example, Japanese Laid-open Patent Publication (Kokai) No. 2005-347620).

In the exposing apparatus, the resist on the front surface of the wafer is irradiated with ultraviolet light or the like in a pattern that is reversed with respect to a desired mask pattern. In recent years, as the desired mask pattern has become finer, UV light of a shorter wavelength, for example a wavelength of 193 nm, has come to be used in such an exposing apparatus. If the wavelength is shorter, then the depth of focus is also reduced, and hence the tolerances on the flatness and the inclination of the wafer are reduced. In particular, with such an exposing apparatus, a plurality of pin-like projections support a rear surface of the wafer, and hence the flatness and the inclination of the wafer are greatly affected by scratches, foreign matter etc. on the rear surface of the wafer.

To realize a complex semiconductor device wiring structure or electrode structure on a wafer, the wafer must be subjected to etching processing in the substrate processing system repeatedly, and each time the etching processing is carried out, the wafer is electrostatically attracted to the electrostatic chuck. The surface of the electrostatic chuck is covered with yttria ($Y_2O_3$), and hence the rear surface of the attracted wafer, which is made of silicon (Si), may be scratched. Moreover, foreign matter present on the surface of the electrostatic chuck may be transferred onto and thus become attached to the rear surface of the wafer.

Foreign matter attached to the rear surface of a wafer can be removed by wet washing using a washing liquid or the like. However, no method is known for effectively removing scratches from the rear surface of a wafer. There is thus a fear that it may become impossible to maintain the flatness of a wafer within the allowed tolerance due to such scratches on the rear surface of the wafer. Moreover, the yttria or the like may flake off (as dust) due to rubbing between scratches on the rear surface of the wafer and the surface of the electrostatic chuck, forming particles. It is thus necessary to prevent the rear surface of a wafer from being scratched when the wafer is attracted by the electrostatic chuck.

SUMMARY OF THE INVENTION

The present provides a substrate processing method that enables a rear surface of a substrate to be prevented from being scratched, such scratches disturbing the flatness of the substrate and causing particles to be produced, and a storage medium in which is computer-readably stored a program for causing a computer to implement the method.

According to a first aspect of the present invention, there is provided a substrate processing method for a substrate processing system having at least an etching apparatus that carries out plasma etching processing on a substrate, the etching apparatus having therein an electrostatic chuck that electrostatically attracts the substrate and is adapted to contact a rear surface of the substrate, the method comprising a coating step of coating a front surface and the rear surface of the substrate with curable resins, a heating step of heating the coated curable resins, an etching step of carrying out the plasma etching processing on the front surface of the substrate, and a washing step of removing the heated curable resins.

According to the above substrate processing method, before the plasma etching processing is carried out on the front surface of the substrate, the curable resin that has been coated onto the rear surface of the substrate is heated, and then after the plasma etching processing has been carried out on the front surface of the substrate, the heated curable resin is removed from the rear surface of the substrate. As a result, the electrostatic chuck contacts a protective film formed by the curable resin being cured on the rear surface of the substrate. The rear surface of the substrate can thus be prevented from being scratched when the substrate is attracted onto the electrostatic chuck, such scratches disturbing the flatness of the substrate and causing particles to be produced.

According to a second aspect of the present invention, there is provided a substrate processing method for a substrate processing system having at least an etching apparatus that carries out plasma etching processing on a substrate, the etching apparatus having therein an electrostatic chuck that electrostatically attracts the substrate and is adapted to contact a rear surface of the substrate, the method comprising a rear surface protective film formation step of forming a protective film on the rear surface of the substrate, an etching step of carrying out the plasma etching processing on a front surface of the substrate, and a protective film removal step of removing the protective film.

With this substrate processing method, before the plasma etching processing is carried out on the front surface of the substrate, a protective film is formed on the rear surface of the substrate, and then after the plasma etching processing has been carried out on the front surface of the substrate, the protective film is removed from the rear surface of the substrate. As a result, the electrostatic chuck contacts the protective film formed on the rear surface of the substrate. The rear surface of the substrate can thus be prevented from being scratched when the substrate is attracted onto the electrostatic chuck, such scratches disturbing the flatness of the substrate and causing particles to be produced.

The substrate processing method can includes a resist film formation step of, after the protective film has been formed on the rear surface but before the plasma etching processing is carried out on the front surface, forming a resist film in a predetermined mask pattern on the front surface of the substrate.

In this case, after the protective film has been formed on the rear surface of the substrate but before the plasma etching processing is carried out on the front surface of the substrate, a resist film is formed in a predetermined mask pattern on the front surface of the substrate. As a result, the formation of the protective film and the formation of the resist film can be carried out separately from one another, and hence the protective film and the resist film can each be formed stably. Moreover, when the resist film is formed by the front surface of the substrate being subjected to light exposure, the rear surface of the substrate is supported by pin-like projections, but the protective film is present between the rear surface of the substrate and the projections. As a result, the substrate can be supported stably, and hence the light exposure can be carried out stably.

The substrate processing method can include a resist film formation step of, before the protective film is formed on the rear surface, forming a resist film in a predetermined mask pattern on the front surface of the substrate.

In this case, before the protective film is formed on the rear surface of the substrate, a resist film is formed in a predetermined mask pattern on the front surface of the substrate. As a result, the formation of the protective film and the formation of the resist film can be carried out separately from one another, and hence the protective film and the resist film can each be formed stably.

In the rear surface protective film formation step, the protective film can be formed by vapor deposition processing.

In this case, the protective film is formed by vapor deposition processing. As a result, the protective film can be formed reliably.

The vapor deposition processing can be CVD processing.

In this case, the protective film is formed by CVD processing. As a result, a protective film of stable thickness can be formed, and hence the rear surface of the substrate can be reliably prevented from being scratched.

In the rear surface protective film formation step, the protective film can be formed by coating processing of a curable resin.

In this case, the protective film is formed by coating processing. As a result, the protective film can be formed simply.

According to a third aspect of the present invention, there is provided a computer-readable storage medium storing a program for causing a computer to implement a substrate processing method for a substrate processing system having at least an etching apparatus that carries out plasma etching processing on a substrate, the etching apparatus having therein an electrostatic chuck that electrostatically attracts the substrate and is configured to contact a rear surface of the substrate, the method comprising a coating step of coating a front surface and the rear surface of the substrate with curable resins, a heating step of heating the coated curable resins, an etching step of carrying out the plasma etching processing on the front surface of the substrate, and a washing step of removing the heated curable resins.

According to a fourth aspect of the present invention, there is provided a computer-readable storage medium storing a program for causing a computer to implement a substrate processing method for a substrate processing system having at least an etching apparatus that carries out plasma etching processing on a substrate, the etching apparatus having therein an electrostatic chuck that electrostatically attracts the substrate and is configured to contact a rear surface of the substrate, the method comprising a rear surface protective film formation step of forming a protective film on the rear surface of the substrate, an etching step of carrying out the plasma etching processing on a front surface of the substrate, and a protective film removal step of removing the protective film.

Further features of the present invention will become apparent from the following description of exemplary embodiments (with reference to the attached drawings).

DETAILED DESCRIPTION OF THE PREFERRED EMBODIMENTS

The present invention will now be described in detail below with reference to the drawings showing preferred embodiments thereof.

First, a substrate processing system that implements a substrate processing method according to a first embodiment of the present invention will be described.

Figure 1:
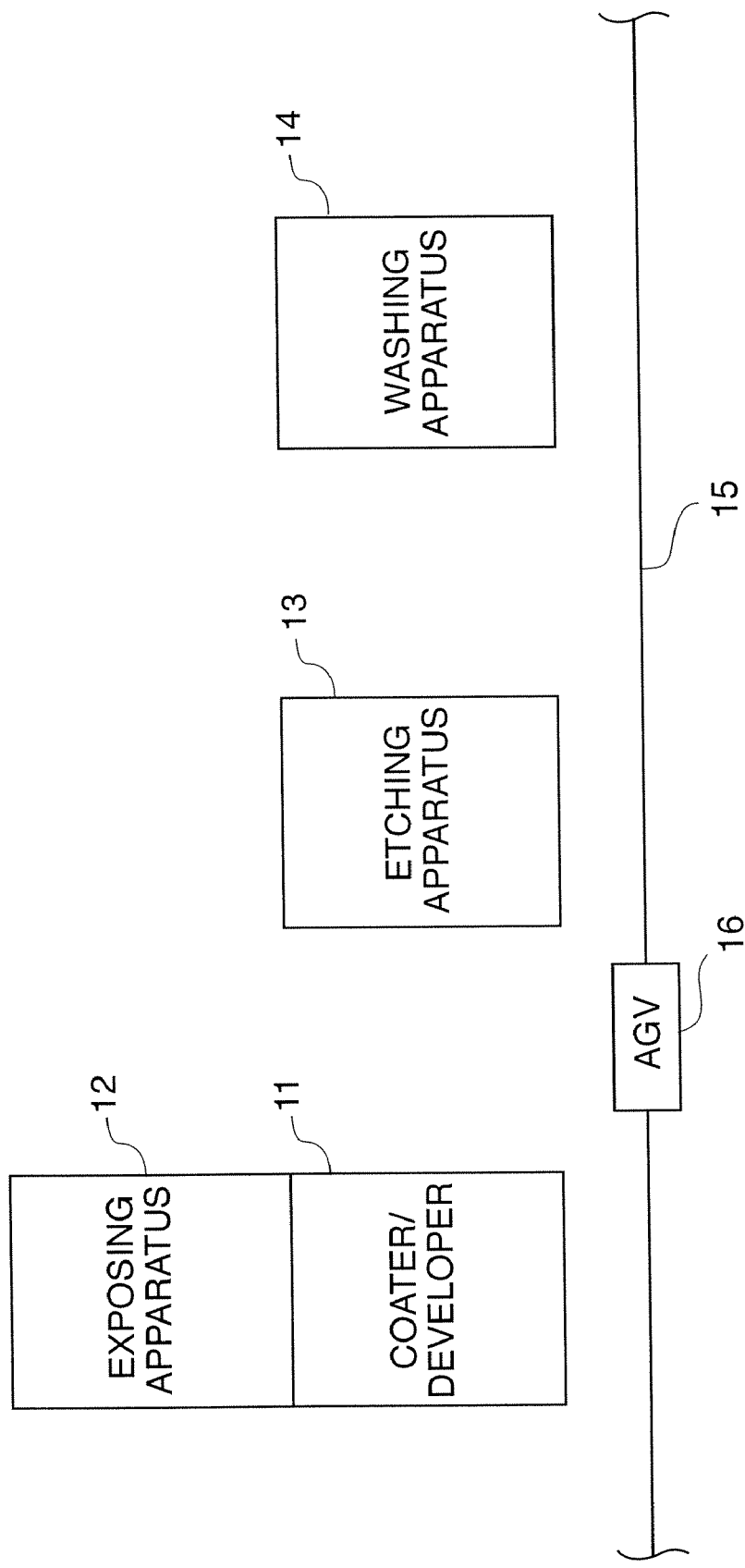
FIG. 1 is a view schematically showing the construction of a substrate processing system that implements a substrate processing method according to a first embodiment of the present invention.

FIG. 1 is a view schematically showing the construction of the substrate processing system that implements the substrate processing method according to the present embodiment.

As shown in FIG. 1, the substrate processing system 10 is comprised of a coater/developer 11, an etching apparatus 13, a washing apparatus 14, a guide rail 15 that is provided parallel to the row of the coater/developer 11, the etching apparatus 13 and the washing apparatus 14, an AGV (automatic guided vehicle) 16, and an exposing apparatus 12 that is disposed adjacent to the coater/developer 11.

The coater/developer 11 has both a function of a coater that coats a resist which is comprised of a positive type curable resin onto a front surface of a semiconductor device wafer (hereinafter referred to merely as a "wafer") (substrate) W, and coats a photocurable resin that can be cured through irradiation with ultraviolet light onto a rear surface of the wafer W, and a function of a developer that uses an alkaline developing liquid to remove, of the resist which has been cured by heating or the like after having been coated on, resist that has been subjected to light exposure processing by the exposing apparatus 12 in a pattern that is reversed with respect to a predetermined mask pattern, so as to form a resist film or the like in the predetermined mask pattern.

The exposing apparatus 12 has a stage (not shown) having pin-like projections on a surface thereof for supporting a wafer W, and an ultraviolet irradiating lamp (not shown) that is disposed facing the stage. The exposing apparatus 12 irradiates ultraviolet light onto the resist which has been coated onto the front surface of the wafer W so as to subject the resist to the light exposure processing. Here, because only a portion of the resist corresponding to the pattern that is reversed with respect to the predetermined mask pattern is irradiated with the ultraviolet light, resist in the reversed pattern is altered so as to become alkali-soluble. When the resist is subjected to the light exposure processing in the exposing apparatus 12, the wafer W is supported by the pin-like projections on the stage.

The etching apparatus 13 has a transfer system for transferring wafers W, and a plurality of processing modules 17, described below, each of which carries out RIE processing on the front surface of a wafer W.

The washing apparatus 14 uses a washing liquid to remove the resist film formed on the front surface and the resin protective film formed on the rear surface of each wafer W.

The AGV 16 is a transporting robot that is freely movable along the guide rail 15, has mounted thereon a wafer cassette CR which is a container housing a plurality of the wafers W, and transfers the wafer cassette CR into and out of the respective apparatuses such as the coater/developer 11. The AGV 16 transfers each wafer cassette CR in the order coater/developer 11, etching apparatus 13, washing apparatus 14.

Figure 2:
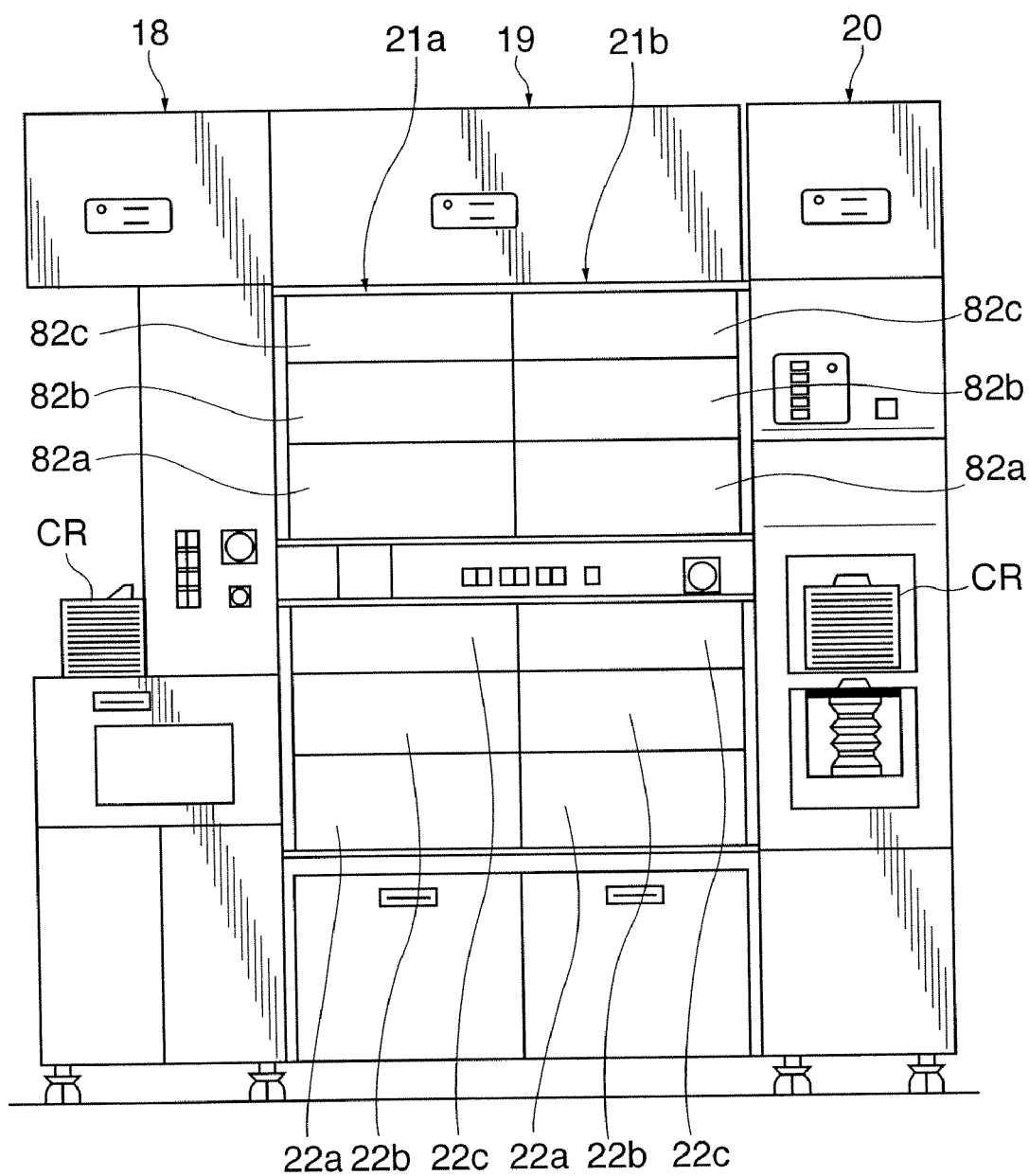
FIG. 2 is a front view schematically showing the construction of a coater/developer appearing in FIG. 1.

FIG. 2 is a front view schematically showing the construction of the coater/developer appearing in FIG. 1.

As shown in FIG. 2, the coater/developer 11 is comprised of a cassette station 18 that carries out handover of each wafer cassette CR between the coater/developer 11 and the AGV 16, a processing station 19 that carries out coating of the resist and the photocurable resin onto each wafer W and developing of the resist film, and an interface section 20 that carries out handover of each wafer W between the coater/developer 11 and the exposing apparatus 12. The cassette station 18, the processing station 19, and the interface section 20 are integrally connected together. The cassette station 18 not only carries out handover of each wafer cassette CR between the coater/developer 11 and the AGV 16, but also transfers wafers W into and out of the wafer cassette CR.

The processing station 19 has various single wafer processing units which are arranged in a plurality of tiers and each of which carries out predetermined processing on one wafer W at a time. The processing station 19 has a plurality of unit groups, a wafer transfer mechanism (not shown) that is disposed such as to be surrounded by the unit groups and distributes the wafers W to the unit groups, and a wafer inverting unit (not shown) that inverts the distributed wafers W. Of the plurality of unit groups, each of unit groups 21a and 21b has two coating units (coaters) 22a and 22c, a wafer inverting unit 22b disposed between the coating units 22a and 22c, a curing unit 82a disposed above the coating unit 22c, and two developing units (developers) 82b and 82c disposed above the curing unit 82a. Another unit group (not shown) has an oven unit having therein a stage on which a wafer W is mounted.

The coating units 22a and 22c respectively coat the resist onto the front surface of a wafer W and coat the photocurable resin onto the rear surface of the wafer W. The developing units 82b and 82c use an alkaline developing liquid to remove, from the front surface of each wafer, resist which has been altered so as to become alkali-soluble by being subjected to light exposure processing. As a result, the developing units 82b and 82c form a resist film in the predetermined mask pattern. The curing unit 82a carries out light exposure processing by irradiating ultraviolet light onto the photocurable resin which has been coated onto the rear surface of each wafer W, thus curing the photocurable resin. Moreover, the oven unit heats and thus cures the resist which has been coated onto the front surface of each wafer W.

Figure 3:
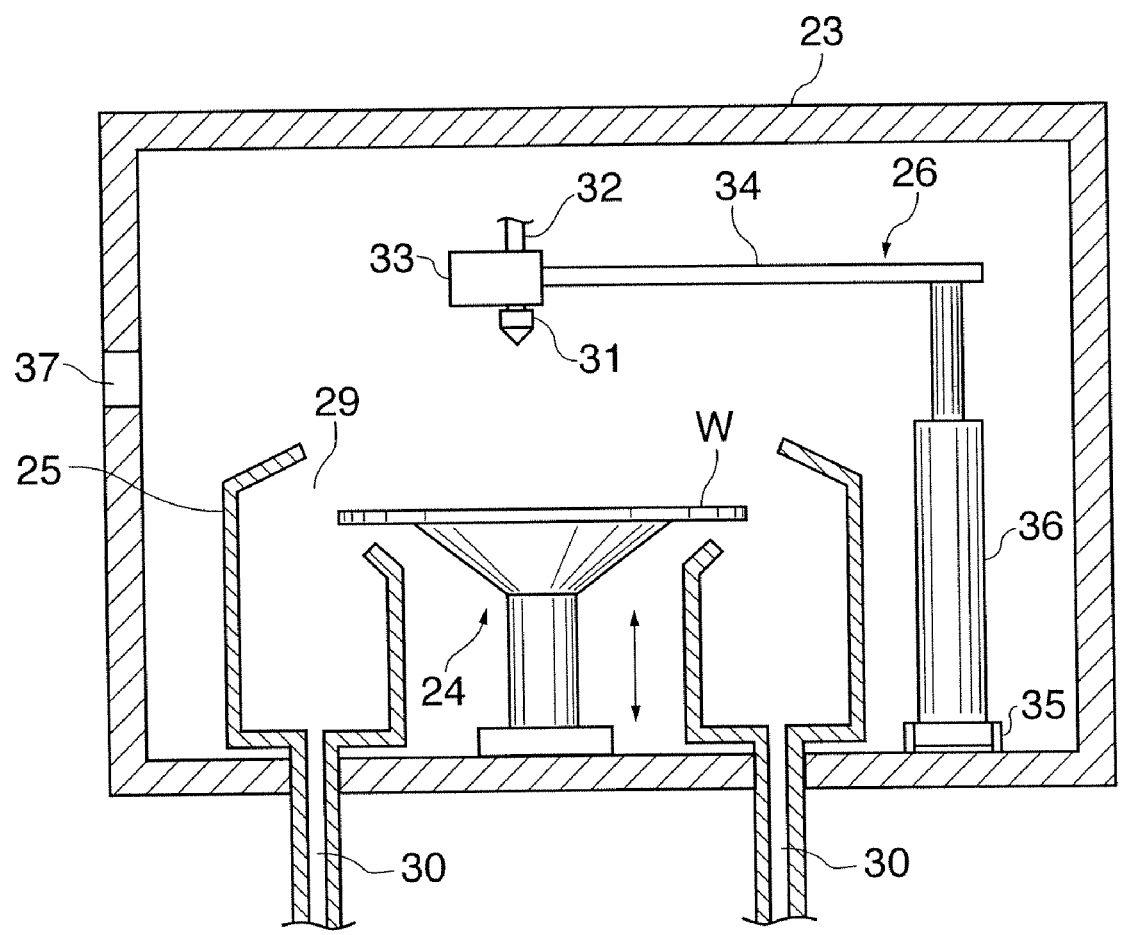
FIG. 3 is a sectional view schematically showing the construction of a coating unit appearing in FIG. 2.

FIG. 3 is a sectional view schematically showing the construction of a coating unit appearing in FIG. 2.

As shown in FIG. 3, the coating unit 22a is comprised of a chamber 23 as a box-shaped housing chamber in which a wafer W is housed, a spinning chuck 24 disposed in a central portion of the chamber 23, an annular cup 25 disposed such as to surround the spinning chuck 24, and a resist ejecting mechanism 26.

The spinning chuck 24 is made of a PEEK resin, and is connected to a spinning motor (not shown), for rotating the mounted wafer W. The wafer W mounted on the spinning chuck 24 rotates in a horizontal plane. Moreover, the spinning chuck 24 can be raised and lowered by an air cylinder (not shown) or the like. The wafer W is chucked on the spinning chuck 24 by a mechanical chuck or a vacuum suction chuck (neither shown).

The cup 25 is an annular vessel, and has an upper portion thereof formed with an opening 29. When the wafer W chucked to the spinning chuck 24 is lowered, the wafer W is housed in the cup 25 through the opening 29. The cup 25 also has an excess liquid discharge pipe 30 in a bottom portion thereof.

The resist ejecting mechanism 26 has a nozzle 31 disposed facing the wafer W chucked to an upper surface of the spinning chuck 24, a resist supply pipe 32 that connects the nozzle 31 to a resist supply apparatus (not shown) that supplies a resist, a nozzle holder 33 to which the nozzle 31 is detachably attached, and a nozzle scanning arm 34 having the nozzle holder 33 on a distal end thereof. The nozzle scanning arm 34 is attached to an upper end of a vertical supporting member 36 that is horizontally movably disposed on a guide rail 35 installed on the bottom portion of the chamber 23. The nozzle scanning arm 34 can thus be moved in a depth direction in FIG. 3 together with the vertical supporting member 36.

A transfer port 37 for the wafers W is provided in a side wall of the chamber 23 in a position at the height of a wafer W that has been lifted up by the spinning chuck 24.

In the coating unit 22a, the nozzle 31 ejects the resist toward the front surface of the wafer W, which rotates in a horizontal plane. Upon the ejected resist reaching the front surface of the wafer W, the resist spreads out uniformly over the front surface of the wafer W through centrifugal force. As a result, the resist is coated uniformly over the front surface of the wafer W (spin coating processing). At this time, excess resist is caught by the cup 25, and discharged to the outside via the excess liquid discharge pipe 30.

On the other hand, the coating unit 22c has, instead of the resist ejecting mechanism 26, a photocurable resin ejecting mechanism that ejects a photocurable resin. Here, before being transferred into the chamber 23 of the coating unit 22c, each wafer W is inverted by the wafer inverting unit 22b. In the coating unit 22c, the photocurable resin ejecting mechanism thus faces the rear surface of the wafer W. The photocurable resin used in the coating unit 22c is, for example, a resin containing a cellulose derivative having carboxyl groups and having an acid value of 30 to 220 mgKOH/g. Alternatively, in the coating unit 22c, instead of the photocurable resin, a thermosetting resin, for example a polyimide-containing resin, may be coated onto the rear surface of the wafer W.

The wafer inverting unit 22b has therein a mechanical chuck that holds a periphery of the wafer W. In the wafer inverting unit 22b, the front surface of the wafer W thus does not contact the mechanical chuck, and hence semiconductor devices being formed on the front surface can be prevented from being damaged.

In the coater/developer 11, a wafer W transferred out from a wafer cassette CR is inverted by the wafer inverting unit 22b, and the photocurable resin is first coated onto the rear surface of the wafer W by the coating unit 22c. The wafer W is then transferred out from the coating unit 22c and into the curing unit 82a. The curing unit 82a carries out light exposure processing by irradiating ultraviolet light onto the photocurable resin that has been coated onto the rear surface of the wafer W, thus curing the photocurable resin. As a result, the photocurable resin coated on the rear surface becomes a resin protective film. After that, the wafer W is inverted by the wafer inverting unit 22b. The resist is then coated by the coating unit 22a onto the front surface of the wafer W, whose front surface is now upward due to the wafer W having been inverted, and after that the wafer W is transferred out from the coating unit 22a and into the oven unit. The oven unit then heats and thus cures the resist that has been coated onto the front surface of the wafer W. After that, the wafer W is transferred into the exposing apparatus 12 by the interface section 20 and mounted on the stage in the exposing apparatus 12. Here, light exposure processing is carried out, ultraviolet light being irradiated from the ultraviolet irradiating lamp toward the front surface of the wafer W onto only a portion corresponding to a pattern that is reversed with respect to the predetermined mask pattern. As a result, resist in the reversed pattern on the front surface of the wafer W is altered so as to become alkali-soluble.

The wafer W on which the resist has been subjected to the light exposure processing in the reversed pattern is then transferred back into the coater/developer 11 by the interface section 20, and the resist in the reversed pattern that has been altered so as to become alkali-soluble is removed from the front surface by an alkaline developing liquid in the developing units 82b and 82c. As a result, a resist film is formed in the predetermined mask pattern on the front surface of the wafer W.

Figure 4:
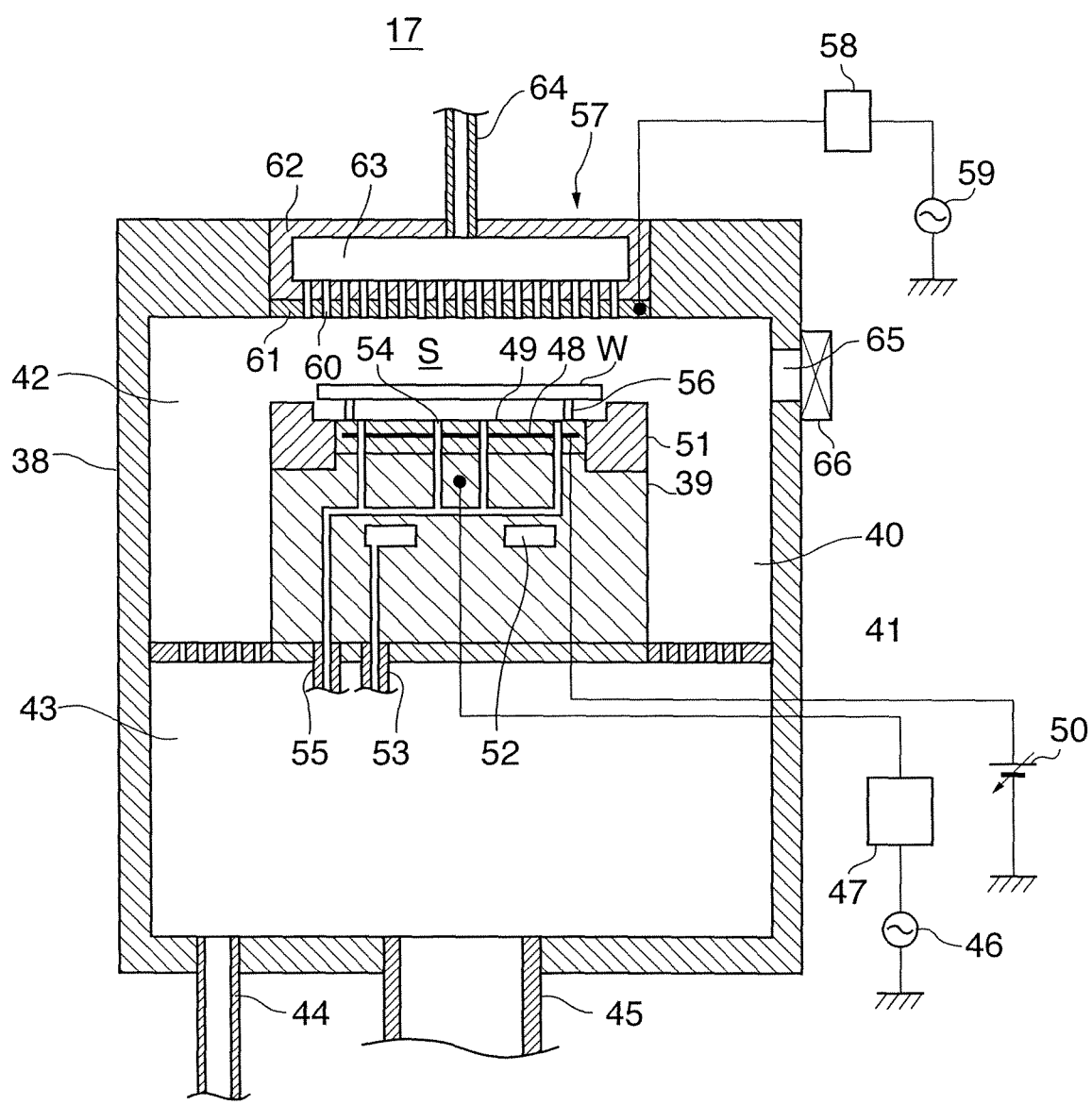
FIG. 4 is a sectional view schematically showing the construction of a processing module of an etching apparatus appearing in FIG. 1.

FIG. 4 is a sectional view schematically showing the construction of a processing module of the etching apparatus appearing in FIG. 1.

As shown in FIG. 4, the processing module 17 has a chamber 38 in which a wafer W is housed. The chamber 38 has disposed therein a cylindrical susceptor 39 as a stage on which the wafer is mounted.

In the processing module 17, a side exhaust path 40 that acts as a flow path through which gas above the susceptor 39 is exhausted out of the chamber 38 is formed between an inner wall of the chamber 38 and a side face of the susceptor 39. A baffle plate 41 is disposed part way along the side exhaust path 40.

The baffle plate 41 is a plate-shaped member having a large number of holes therein, and acts as a partitioning plate that partitions the chamber 38 into an upper portion and a lower portion. The upper portion 42 of the chamber 38 partitioned by the baffle plate 41 has disposed therein the susceptor 39 on which the wafer W is mounted, and has plasma produced therein. Hereinafter, the upper portion 42 of the chamber 38 is referred to as the "reaction chamber". Moreover, a roughing exhaust pipe 44 and a main exhaust pipe 45 that exhaust gas out from the chamber 38 are opened to the lower portion (hereinafter referred to as the "manifold") 43 of the chamber 38. The roughing exhaust pipe 44 has a DP (dry pump) (not shown) connected thereto, and the main exhaust pipe 45 has a TMP (turbo-molecular pump) (not shown) connected thereto. Moreover, the baffle plate 41 captures or reflects ions and radicals produced in a processing space S, described below, in the reaction chamber 42, thus preventing leakage of the ions and radicals into the manifold 43.

The roughing exhaust pipe 44, the main exhaust pipe 45, the DP, the TMP, and so on together constitute an exhausting apparatus. The roughing exhaust pipe 44 and the main exhaust pipe 45 exhaust gas in the reaction chamber 42 out of the chamber 38 via the manifold 43. Specifically, the roughing exhaust pipe 44 reduces the pressure in the chamber 38 from atmospheric pressure down to a low vacuum state, and the main exhaust pipe 45 is operated in collaboration with the roughing exhaust pipe 44 to reduce the pressure in the chamber 38 from atmospheric pressure down to a high vacuum state (e.g. a pressure of not more than 133 Pa (1 torr)), which is at a lower pressure than the low vacuum state.

A lower radio frequency power source 46 is connected to the susceptor 39 via a matcher 47. The lower radio frequency power source 46 supplies predetermined radio frequency electrical power to the susceptor 39. The susceptor 39 thus acts as a lower electrode. The matcher 47 reduces reflection of the radio frequency electrical power from the susceptor 39 so as to maximize the efficiency of the supply of the radio frequency electrical power into the susceptor 39.

Provided in an upper portion of the susceptor 39 is a disk-shaped electrostatic chuck 49 made of an insulating material, for example yttria, alumina ($Al_2O_3$) or silica ($SiO_2$), having an electrode plate 48 therein. When a wafer W is mounted on the susceptor 39, the wafer W is disposed on the electrostatic chuck 49. A DC power source 50 is electrically connected to the electrode plate 48. Upon a negative DC voltage being applied to the electrode plate 48, a positive potential is produced on the rear surface of the wafer W, and a negative potential is produced on the front surface of the wafer. A potential difference thus arises between the electrode plate 48 and the rear surface of the wafer W, and hence the wafer W is attracted to and held on an upper surface of the electrostatic chuck 49 through a Coulomb force or a Johnsen-Rahbek force due to the potential difference.

Moreover, an annular focus ring 51 is provided on an upper portion of the susceptor 39 so as to surround the wafer W attracted to and held on the electrostatic chuck 49. The focus ring 51 is exposed to the processing space S, and focuses plasma in the processing space S toward the front surface of the wafer W, thus improving the efficiency of the RIE processing.

An annular coolant chamber 52 that extends, for example, in a circumferential direction of the susceptor 39 is provided inside the susceptor 39. A coolant, for example cooling water or a Galden fluid, at a predetermined temperature is circulated through the coolant chamber 52 via coolant piping 53 from a chiller unit (not shown). A processing temperature of the wafer W attracted to and held on the electrostatic chuck 49 is controlled through the temperature of the coolant.

A plurality of heat-transmitting gas supply holes 54 are opened to a portion of the electrostatic chuck 49 on which the wafer W is attracted and held (hereinafter referred to as the "attracting surface"). The heat-transmitting gas supply holes 54 are connected to a heat-transmitting gas supply unit (not shown) by a heat-transmitting gas supply line 55. The heat-transmitting gas supply unit supplies helium gas as a heat-transmitting gas via the heat-transmitting gas supply holes 54 into a gap between the attracting surface of the electrostatic chuck 49 and the rear surface of the wafer W. The helium gas supplied into the gap between the attracting surface of the electrostatic chuck 49 and the rear surface of the wafer W transmits heat from the wafer W to the susceptor 39 via the electrostatic chuck 49.

A plurality of pusher pins 56 are provided in the attracting surface of the susceptor 39 as lifting pins that can be made to project out from the electrostatic chuck 49. The pusher pins 56 are connected to a motor (not shown) by a ball screw (not shown), and can be made to project out from the attracting surface of the susceptor 39 through rotational motion of the motor, which is converted into linear motion by the ball screw. The pusher pins 56 are housed inside the susceptor 39 when a wafer W is being attracted to and held on the attracting surface of the susceptor 39 so that the front surface of the wafer W can be subjected to the RIE processing, and are made to project out from the electrostatic chuck 49 so as to lift the wafer W up away from the susceptor 39 when the wafer W is to be transferred out from the chamber 38 after having been subjected to the RIE processing.

A gas introducing shower head 57 is disposed in a ceiling portion of the chamber 38 (the reaction chamber 42) such as to face the susceptor 39. An upper radio frequency power source 59 is connected to the gas introducing shower head 57 via a matcher 58. The upper radio frequency power source 59 supplies predetermined radio frequency electrical power to the gas introducing shower head 57. The gas introducing shower head 57 thus acts as an upper electrode. The matcher 58 has a similar function to the matcher 47, described earlier.

The gas introducing shower head 57 has a ceiling electrode plate 61 having a large number of gas holes 60 therein, and an electrode support 62 on which the ceiling electrode plate 61 is detachably supported. A buffer chamber 63 is provided inside the electrode support 62. A processing gas introducing pipe 64 is connected to the buffer chamber 63. A processing gas supplied from the processing gas introducing pipe 64 into the buffer chamber 63 is supplied by the gas introducing shower head 57 into the chamber 38 (the reaction chamber 42) via the gas holes 60.

A transfer port 65 for the wafers W is provided in a side wall of the chamber 38 in a position at the height of a wafer W that has been lifted up from the susceptor 39 by the pusher pins 56. A vacuum gate valve 66 for opening and closing the transfer port 65 is provided in the transfer port 65.

Radio frequency electrical power is supplied to the susceptor 39 and the gas introducing shower head 57 in the chamber 38 of the processing module 17 as described above so as to apply radio frequency electrical power into the processing space S between the susceptor 39 and the gas introducing shower head 57, whereupon the processing gas supplied into the processing space S from the gas introducing shower head 57 is turned into high-density plasma, whereby ions and radicals are produced; the front surface of the wafer W is subjected to the RIE processing by the ions and so on.

Figure 5:
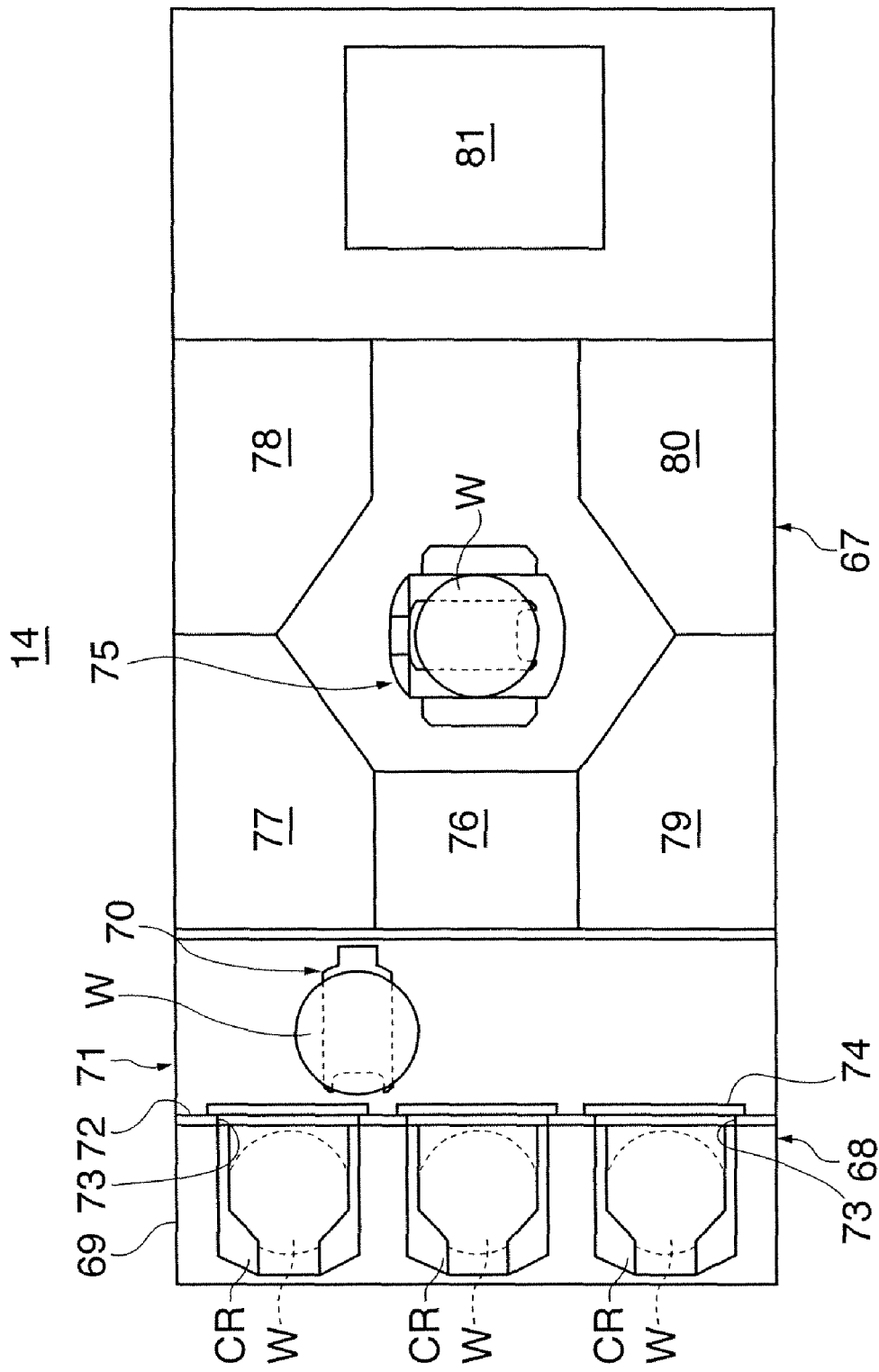
FIG. 5 is a plan view schematically showing the construction of a washing apparatus appearing in FIG. 1.

FIG. 5 is a plan view schematically showing the construction of the washing apparatus appearing in FIG. 1.

As shown in FIG. 5, the washing apparatus 14 is comprised of a washing processing section 67 that carries out washing processing on a wafer W that has been subjected to the RIE processing, and a transfer section 68 for transferring the wafer W into and out of the washing processing section 67.

The transfer section 68 is comprised of a cassette stage 69 for mounting wafer cassettes CR handed over from the AGV 16, and a wafer transfer section 71 having a transfer arm-type wafer transferring apparatus 70 that carries out handover of wafers W between the wafer cassettes CR and the washing processing section 67. An upright partitioning wall 72 is provided between the cassette stage 69 and the wafer transfer section 71. Ports 73 are formed in the partitioning wall 72 in positions corresponding respectively to the wafer cassettes CR mounted on the cassette stage 69. On the wafer transfer section 71 side of each port 73 is provided a port opening/closing mechanism 74 for opening and closing that port 73 using a shutter or the like.

The wafer transferring apparatus 70 is movable in a horizontal direction and a vertical direction, and rotatable in a horizontal plane. The wafer transferring apparatus 70 transfers each wafer W from the transfer section 68 into the washing processing section 67, and from the washing processing section 67 into the transfer section 68.

The washing processing section 67 is comprised of a main wafer transferring apparatus 75, which is transfer arm-type transfer means, a wafer handover unit 76 on which each wafer W is temporarily mounted when being handed over between the main wafer transferring apparatus 75 and the wafer transfer section 71, substrate washing units 77, 78, 79, and 80, and a washing liquid storage unit 81 that stores a predetermined washing liquid that is fed to the substrate washing units 77, 78, 79, and 80. The main wafer transferring apparatus 75 is movable in a horizontal direction and a vertical direction, and rotatable in a horizontal plane. The main wafer transferring apparatus 75 is able to access all of the wafer transferring apparatus 70, and the substrate washing units 77, 78, 79, and 80.

Each of the substrate washing units 77, 78, 79, and 80 houses a wafer W therein, and sprays a washing liquid, for example an alkaline aqueous solution, a hydrogen peroxide aqueous solution, or sulfated water, toward the housed wafer W. The washing liquid dissolves and thus removes the resist film formed on the front surface of the wafer W, and moreover dissolves and thus removes the resin protective film formed on the rear surface of the wafer W.

Next, the substrate processing method according to the present embodiment will be described.

Figure 6:
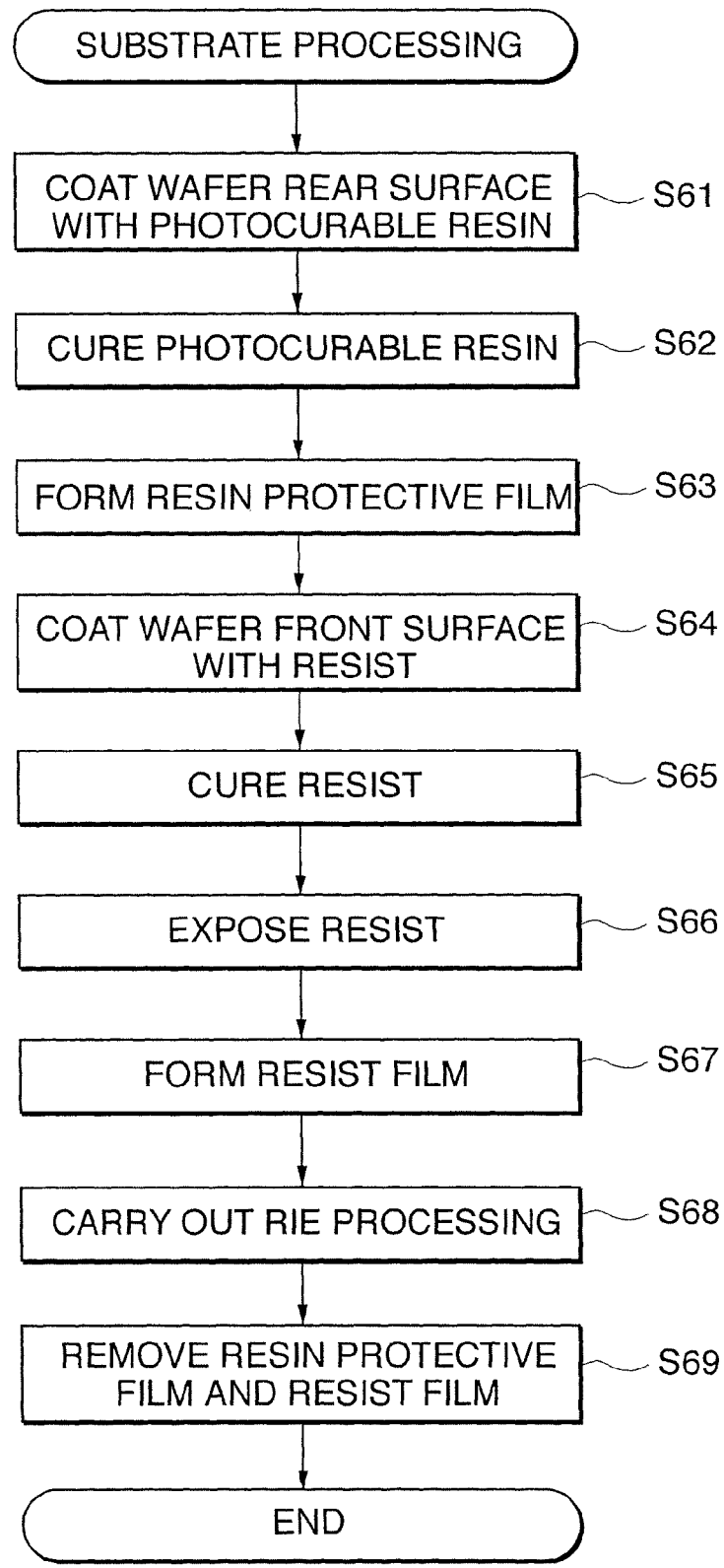
FIG. 6 is a flowchart of the substrate processing method according to the above embodiment.

FIG. 6 is a flowchart of the substrate processing method according to the present embodiment.

As shown in FIG. 6, first, the AGV 16 hands over a wafer cassette CR to the coater/developer 11, and in the coater/developer 11, a wafer W is taken out from the wafer cassette CR by the cassette station 18, inverted by the wafer inverting unit, and transferred into the chamber 23 of the coating unit 22c by the wafer transfer mechanism, and a photocurable resin is coated onto the rear surface of the wafer W by the coating unit 22c (step S61) (coating step).

Next, in the coater/developer 11, the wafer W is transferred into the curing unit 82a, and the curing unit 82a subjects the photocurable resin that has been coated onto the rear surface of the wafer W to light exposure processing, thus curing the photocurable resin (step S62) (curing step). As a result, a resin protective film is formed on the rear surface of the wafer W (step S63) (rear surface protective film formation step).

Next, in the coater/developer 11, the wafer W is inverted by the wafer inverting unit, and transferred into the chamber 23 of the coating unit 22a, and a resist is coated onto the front surface of the wafer W by the coating unit 22a (step S64) (coating step).

Next, in the coater/developer 11, the wafer W having the resist coated thereon is transferred into the oven unit, and the oven unit heats and thus cures the resist that has been coated onto the front surface of the wafer W (step S65) (curing step).

Next, in the coater/developer 11, the wafer W is transferred into the exposing apparatus 12 by the interface section 20, and the exposing apparatus 12 subjects the resist to light exposure processing, irradiating ultraviolet light from the ultraviolet irradiating lamp toward the front surface of the wafer W onto only a portion corresponding to a pattern that is reversed with respect to a predetermined mask pattern (step S66). As a result, resist in the reversed pattern on the front surface of the wafer W is altered so as to become alkali-soluble.

Next, the wafer W on which the resist has been subjected to the light exposure processing is transferred into the coater/developer 11 by the interface section 20 of the coater/developer 11, and the resist in the reversed pattern that has been altered so as to become alkali-soluble is removed from the front surface by the developing units 82b and 82c. As a result, a resist film is formed on the front surface of the wafer W in the predetermined mask pattern (step S67).

Next, in the coater/developer 11, the wafer W on which the resist film has been formed is housed in a wafer cassette CR by the cassette station 18, and the wafer cassette CR is handed over to the AGV 16. The AGV 16 then moves from the coater/developer 11 to the etching apparatus 13, and hands over the wafer cassette CR to the transfer system of the etching apparatus 13. In the etching apparatus 13, the wafer W is taken out from the wafer cassette CR and transferred into the chamber 38 of a processing module 17 by the transfer system, and the wafer W is attracted to and held on the electrostatic chuck 49 of the susceptor 39. The etching apparatus 13 then subjects the front surface of the wafer W to RIE processing in the processing module 17 (step S68) (etching step).

Next, the wafer W that has been subjected to the RIE processing is housed in the wafer cassette CR by the transfer system of the etching apparatus 13, and the wafer cassette CR is handed over to the AGV 16. The AGV 16 then moves from the etching apparatus 13 to the washing apparatus 14, and hands over the wafer cassette CR to the transfer section 68 of the washing apparatus 14. In the washing apparatus 14, the wafer W is transferred from the wafer cassette CR into the washing processing section 67 by the wafer transfer section 71, and is transferred into the substrate washing unit 77 or the like by the main wafer transferring apparatus 75, and then the substrate washing unit 77 or the like is used to dissolve and thus remove the resist film formed on the front surface of the wafer W, and moreover dissolve and thus remove the resin protective film formed on the rear surface of the wafer W (step S69) (washing step, protective film removal step), whereupon the present process comes to an end.

According to the process of FIG. 6, before the front surface of the wafer W is subjected to the RIE processing, a photocurable resin that has been coated on the rear surface of the wafer W is subjected to light exposure processing by being irradiated with ultraviolet light so as to form a resin protective film, and then after the front surface of the wafer W has been subjected to the RIE processing, the resin protective film is removed from the rear surface of the wafer W. As a result, the electrostatic chuck 49 contacts the resin protective film formed on the rear surface of the wafer W. The rear surface of the wafer W can thus be prevented from being scratched when the wafer W is attracted onto the electrostatic chuck 49, and furthermore close contact between the wafer W and the electrostatic chuck 49 can be improved, and hence the controllability of the temperature of the wafer W can be improved.

Moreover, according to the process of FIG. 6, after the resin protective film has been formed on the rear surface of the wafer W but before the front surface of the wafer W is subjected to the RIE processing, a resist film is formed on the front surface of the wafer W in a predetermined mask pattern. As a result, the formation of the resin protective film and the formation of the resist film can be carried out separately from one another, and hence the resin protective film and the resist film can each be formed stably. Moreover, when the resist film is formed by the front surface of the wafer W being subjected to light exposure, in the exposing apparatus 12, the rear surface of the wafer W is supported by the pin-like projections on the stage, but the resin protective film is present between the rear surface of the wafer W and the projections. As a result, the wafer W can be supported stably, and hence the light exposure can be carried out stably. Furthermore, when the wafer W is mounted on the stage in the oven unit, again, it is the stage and the resin protective film on the rear surface of the wafer W that come into contact. As a result, in the oven unit, again, the rear surface of the wafer W can be prevented from being scratched, and moreover close contact between the wafer W and the stage can be improved.

Moreover, according to the process of FIG. 6, the resin protective film is formed by spin coating processing (coating processing). As a result, the resin protective film can be formed simply.

In the process of FIG. 6 described above, the resist film is formed on the front surface of the wafer W after the resin protective film has been formed on the rear surface of the wafer W. However, the resist film may alternatively be formed on the front surface of the wafer W before the resin protective film is formed on the rear surface of the wafer W. In this case, again, the formation of the resin protective film and the formation of the resist film can be carried out separately from one another, and hence the resin protective film and the resist film can each be formed stably.

Moreover, in the process of FIG. 6, the resist film on the front surface of the wafer W and the resin protective film on the rear surface of the wafer W are removed by being dissolved using a washing liquid. However, the method of removing the resin protective film is not limited to this, but rather may alternatively be, for example, ashing processing using oxygen radicals or the like.

Moreover, the processing station 19 of the coater/developer 11 need not have a wafer inverting unit. In this case, a coating unit thereof preferably has, in addition to the resist ejecting mechanism 26, a nozzle that sprays the photocurable resin toward the rear surface of a wafer W from below the wafer W, which rotates in a horizontal plane. The photocurable resin is sticky, and hence becomes attached to the rear surface of the wafer W, and then spreads out uniformly over the rear surface of the wafer W through centrifugal force.

Furthermore, instead of forming the resin protective film on the rear surface of each wafer W by spin coating processing as described above, the resin protective film may alternatively be formed by sticking a resin sheet onto the rear surface of the wafer W.

Next, a substrate processing system that implements a substrate processing method according to a second embodiment of the present invention will be described.

The present embodiment is basically the same as the first embodiment described above in terms of construction and operation, only part of the construction of the substrate processing system and some of the steps of the substrate processing method different from the first embodiment. Features of the construction and operation, and steps that are the same as in the first embodiment will thus not be described, only features that are different from the first embodiment being described below.

Figure 7:
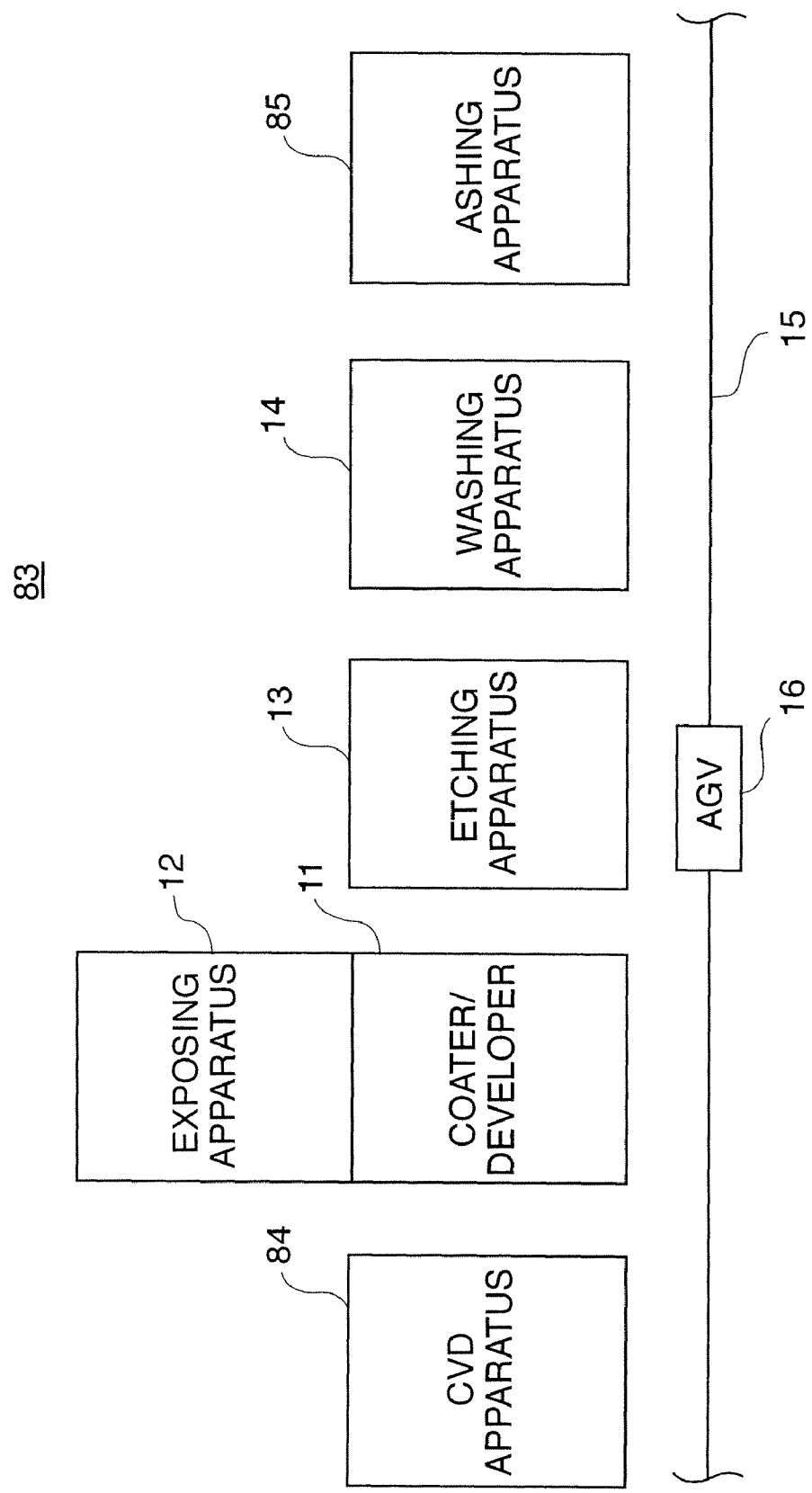
FIG. 7 is a view schematically showing the construction of a substrate processing system that implements a substrate processing method according to a second embodiment of the present invention.

FIG. 7 is a view schematically showing the construction of the substrate processing system that implements the substrate processing method according to the present embodiment.

As shown in FIG. 7, the substrate processing system 83 is comprised of a CVD (chemical vapor deposition) apparatus 84, the coater/developer 11, the etching apparatus 13, the washing apparatus 14, an ashing apparatus 85, a guide rail 15 that is provided parallel to the CVD apparatus 84, the coater/ developer 11, the etching apparatus 13, the washing apparatus 14 and the ashing apparatus 85, the AGV 16, and the exposing apparatus 12 which is disposed adjacent to the coater/developer 11.

The CVD apparatus 84 has a transfer system for transferring wafers W, and a plurality of processing modules 86, described below, each of which forms a CF-type protective film on the rear surface of a wafer W by CVD processing.

The ashing apparatus 85 has a transfer system for transferring wafers W, and a plurality of processing modules each of which carries out ashing processing on the rear surface of a wafer W. The processing modules in the ashing apparatus 85 have a similar construction to the processing modules 17 in the etching apparatus 13.

The AGV 16 transfers each wafer cassette CR in the order CVD apparatus 84, coater/developer 11, etching apparatus 13, washing apparatus 14, and ashing apparatus 85.

Figure 8:
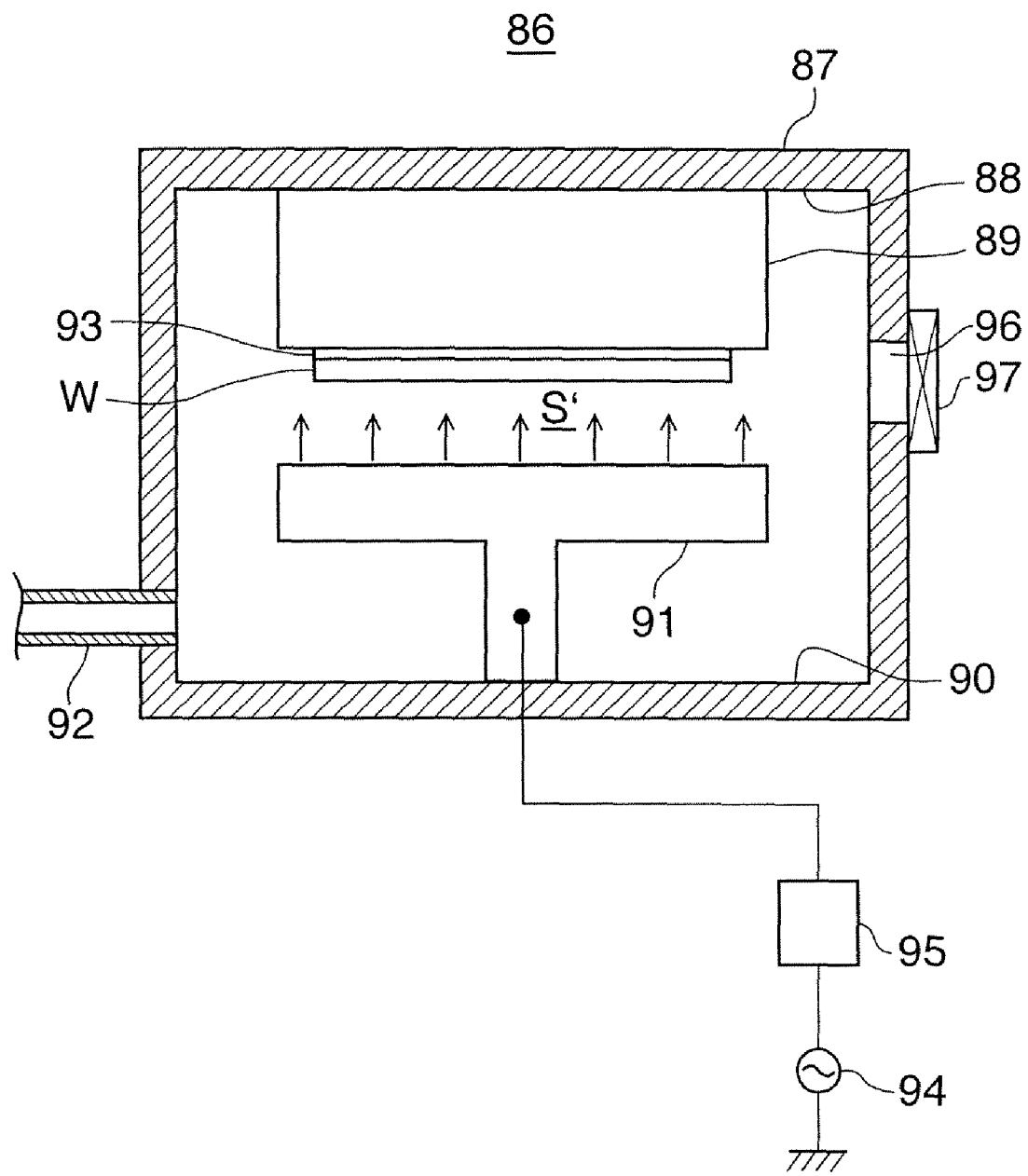
FIG. 8 is a sectional view schematically showing the construction of a processing module of a CVD apparatus appearing in FIG. 7.

FIG. 8 is a sectional view schematically showing the construction of a processing module of the CVD apparatus appearing in FIG. 7.

As shown in FIG. 8, each processing module 86 has a chamber 87 as a box-shaped housing chamber in which a wafer W is housed, a wafer attracting portion 89 that is disposed on a ceiling portion 88 of the chamber 87, an electrode 91 that is disposed on a bottom portion 90 of the chamber 87 facing the wafer attracting portion 89 separated from the wafer attracting portion 89 by a predetermined distance, and an exhaust pipe 92 for exhausting gas out from the chamber 87.

The wafer attracting portion 89 is a cylindrical protrusion, and has a plurality of vacuum suction holes (not shown) opened to a bottom surface thereof. A wafer W transferred into the chamber 87 is attracted by vacuum suction by the vacuum suction holes in the wafer attracting portion 89, and thus held on the bottom surface of the wafer attracting portion 89. Moreover, the wafer attracting portion 89 has a cushioning film 93 made of a heat-resistant resin such as a polyimide on the bottom surface thereof. The front surface of the wafer W thus contacts the bottom surface of the wafer attracting portion 89 via the cushioning film 93, and hence there is no destruction of the shape of wiring grooves or via holes formed on the front surface of the wafer W. Moreover, the wafer attracting portion 89 has a heater (not shown) built therein, so that a temperature of the wafer W is held at a predetermined temperature while a protective film is being formed on the rear surface of the wafer W.

The electrode 91 is comprised of a table-shaped electrically conductive member, and has a plurality of gas jetting holes (not shown) in a surface thereof facing the wafer attracting portion 89 (the upper surface). Moreover, a radio frequency power source 94 is connected to the electrode 91 via a matcher 95. The radio frequency power source 94 supplies predetermined radio frequency electrical power to the electrode 91. The electrode 91 thus applies radio frequency electrical power into a processing space S' between the wafer attracting portion 89 and the electrode 91. The matcher 95 reduces reflection of the radio frequency electrical power from the electrode 91 so as to maximize the efficiency of the supply of the radio frequency electrical power into the electrode 91.

A transfer port 96 for the wafers W is provided in a side wall of the chamber 87 in a position at the height of a wafer W that is being attracted to the wafer attracting portion 89. A vacuum gate valve 97 for opening and closing the transfer port 96 is provided in the transfer port 96.

In the processing module 86, the protective film is formed on the rear surface of the wafer W by CVD processing.

Specifically, upon a depositable processing gas such as a CF-type gas being supplied into the processing space SI from the gas jetting holes in the electrode 91, and radio frequency electrical power being applied into the processing space S', radicals and ions are produced from the CF-type gas, and these radicals and so on become attached to and accumulate on the rear surface of the wafer W attracted to the wafer attracting portion 89, thus forming a CF-type protective film. At this time, excess radicals and so on are exhausted to the outside by the exhaust pipe 92.

The protective film formed in the processing module 86 preferably has a thickness of not more than 10 μm, preferably approximately 1 μm. Note that the type of the protective film formed is not limited to being a CF-type protective film, but rather may alternatively be a protective film made of amorphous carbon.

Moreover, in a processing module of the ashing apparatus 85, a wafer W having the CF-type protective film formed on the rear surface thereof is transferred into the chamber 38 and supported by the pusher pins 56, and then oxygen ($O_2$) gas is introduced into the processing space S from the gas introducing shower head 57. At this time, the pusher pins 56 support the wafer W in a state lifted up from the susceptor 39. There is thus a space below the rear surface of the wafer W.

Upon radio frequency electrical power being supplied to the susceptor 39 and the gas introducing shower head 57 so as to apply radio frequency electrical power into the processing space S between the susceptor 39 and the gas introducing shower head 57, plasma is produced from the oxygen gas in the processing space S, whereby oxygen radicals are produced. At this time, the oxygen radicals go round into the space below the rear surface of the wafer W, and hence the oxygen radicals decompose and thus remove the CF-type protective film on the rear surface of the wafer W (ashing processing).

In the processing module described above, the CF-type protective film is removed by oxygen radicals, but alternatively fluorine radicals may be produced in the processing space S, the CF-type protective film on the rear surface of the wafer W being decomposed and thus removed by the fluorine radicals, or ozone gas may be supplied into the processing space S, the CF-type protective film being decomposed and thus removed by the ozone gas.

Next, the substrate processing method according to the present embodiment will be described.

Figure 9:
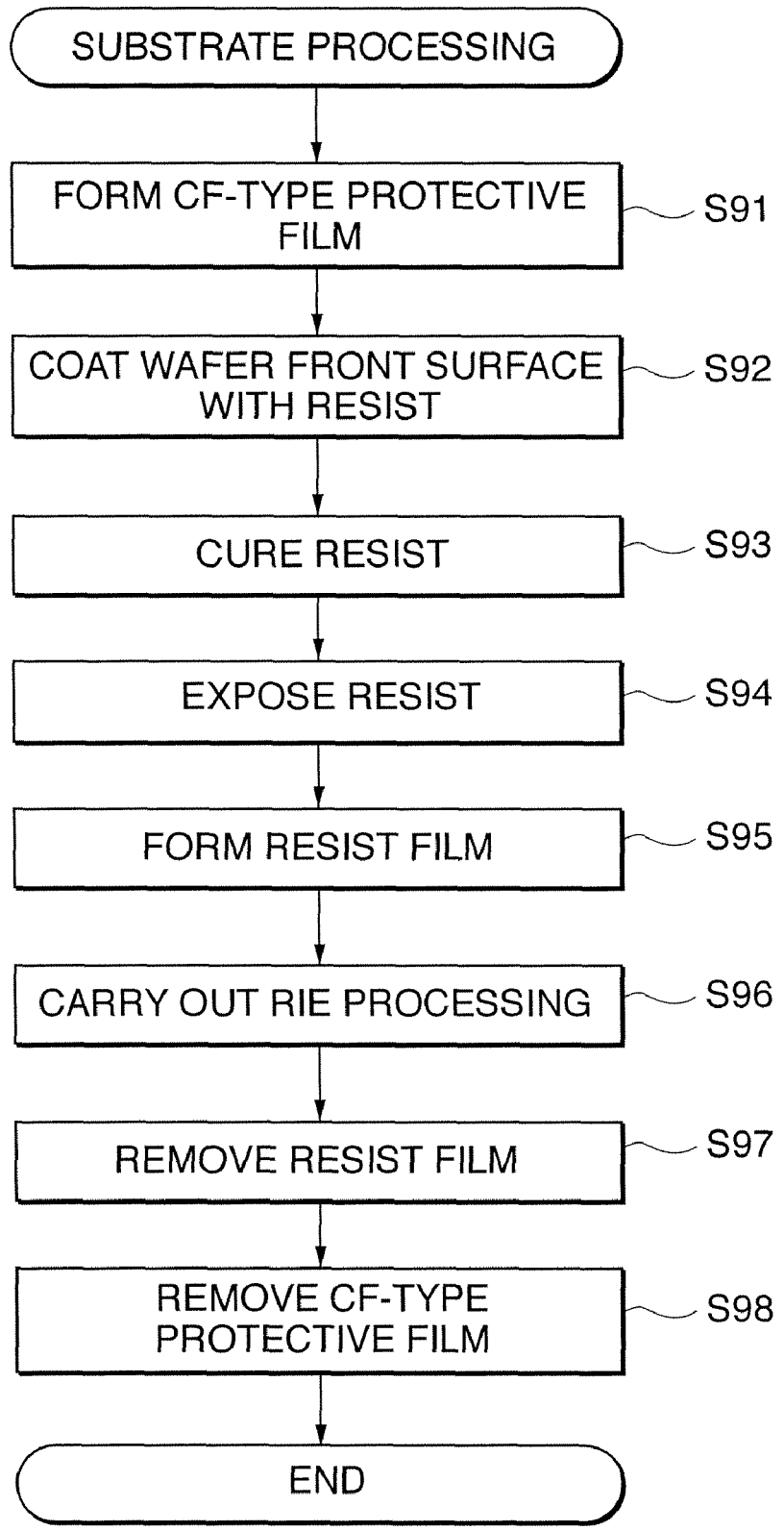
FIG. 9 is a flowchart of the substrate processing method according to the above embodiment.

FIG. 9 is a flowchart of the substrate processing method according to the present embodiment.

As shown in FIG. 9, first, the AGV 16 hands over a wafer cassette CR to the CVD apparatus 84, and in the CVD apparatus 84, a wafer W is transferred from the wafer cassette CR into the chamber 87 of a processing module 86 by the transfer system, and a CF-type protective film is formed on the rear surface of the wafer W in the processing module 86 (step S91) (rear surface protective film formation step).

Next, in the CVD apparatus 84, the wafer W on which the CF-type protective film has been formed is housed in a wafer cassette CR by the transfer system, and the wafer cassette CR is handed over to the AGV 16. The AGV 16 then moves from the CVD apparatus 84 to the coater/developer 11, and hands over the wafer cassette CR to the coater/developer 11. In the coater/developer 11, the wafer W is taken out from the wafer cassette CR by the cassette station 18, and transferred into the chamber 23 of the coating unit 22a by the wafer transfer mechanism, and a resist is coated onto the front surface of the wafer W by the resist ejecting mechanism 26 (step S92).

Next, in the coater/developer 11, the wafer W having the resist coated thereon is transferred into the oven unit, and the oven unit heats and thus cures the resist that has been coated onto the front surface of the wafer W (step S93) (curing step).

Next, in the coater/developer 11, the wafer W is transferred into the exposing apparatus 12 by the interface section 20, and the exposing apparatus 12 subjects the resist to light exposure processing, irradiating ultraviolet light from the ultraviolet irradiating lamp toward the front surface of the wafer W onto only a portion corresponding to a pattern that is reversed with respect to a predetermined mask pattern (step S94). As a result, resist in the reversed pattern is altered so as to become alkali-soluble.

Next, the wafer W on which the resist has been subjected to the light exposure processing is transferred into the coater/developer 11 by the interface section 20 of the coater/developer 11, and the resist in the reversed pattern that has been altered so as to become alkali-soluble is removed from the front surface by the developing units 82b and 82c. As a result, a resist film is formed on the front surface of the wafer W in the predetermined mask pattern (step S95).

Next, in the coater/developer 11, the wafer W on which the resist film has been formed is housed in a wafer cassette CR by the cassette station 18, and the wafer cassette CR is handed over to the AGV 16. The AGV 16 then moves from the coater/developer 11 to the etching apparatus 13, and hands over the wafer cassette CR to the transfer system of the etching apparatus 13. In the etching apparatus 13, the wafer W is taken out from the wafer cassette CR and transferred into the chamber 38 of a processing module 17 by the transfer system, and the wafer W is attracted to and held on the electrostatic chuck 49 of the susceptor 39. The etching apparatus 13 then subjects the front surface of the wafer W to RIE processing in the processing module 17 (step S96) (etching step).

Next, the wafer W that has been subjected to the RIE processing is housed in the wafer cassette CR by the transfer system of the etching apparatus 13, and the wafer cassette CR is handed over to the AGV 16. The AGV 16 then moves from the etching apparatus 13 to the washing apparatus 14, and hands over the wafer cassette CR to the transfer section 68 of the washing apparatus 14. In the washing apparatus 14, the wafer W is transferred from the wafer cassette CR into the washing processing section 67 by the wafer transfer section 71, and is transferred into the substrate washing unit 77 or the like by the main wafer transferring apparatus 75, and then the substrate washing unit 77 or the like is used to dissolve and thus remove the resist film formed on the front surface of the wafer W (step S97) (washing step).

Next, in the washing apparatus 14, the wafer W from which the resist film has been removed is housed in the wafer cassette CR by the wafer transfer section 71, and the wafer cassette CR is handed over to the AGV 16. The AGV 16 then moves from the washing apparatus 14 to the ashing apparatus 85, and hands over the wafer cassette CR to the transfer system of the ashing apparatus 85. In the ashing apparatus 85, the wafer W is taken out from the wafer cassette CR and transferred into the chamber 38 of a processing module by the transfer system, and then the CF-type protective film on the rear surface of the wafer W is decomposed and thus removed by ashing processing in the processing module (step S98) (protective film removal step), whereupon the present process comes to an end.

According to the process of FIG. 9, before the front surface of the wafer W is subjected to the RIE processing, a CF-type protective film is formed on the rear surface of the wafer W, and then after the front surface of the wafer W has been subjected to the RIE processing, the CF-type protective film is removed from the rear surface of the wafer W. As a result, the electrostatic chuck 49 contacts the CF-type protective film formed on the rear surface of the wafer W. Effects as in the first embodiment can thus be achieved.

Moreover, according to the process of FIG. 9, after the CF-type protective film has been formed on the rear surface of the wafer W but before the front surface of the wafer W is subjected to the RIE processing, a resist film is formed on the front surface of the wafer W in a predetermined mask pattern. As a result, the formation of the CF-type protective film and the formation of the resist film can be carried out separately from one another, and furthermore when the resist film is formed, the CF-type protective film is present between the rear surface of the wafer W and the projections on the stage in the exposing apparatus 12. Effects as in the first embodiment can thus be achieved.

Moreover, according to the process of FIG. 9, the CF-type protective film is formed by CVD processing, which is vapor deposition processing. As a result, a CF-type protective film of stable thickness can be formed reliably, and hence the rear surface of the wafer W can be reliably prevented from being scratched.

In the process of FIG. 9 described above, the resist film is formed on the front surface of the wafer W after the CF-type protective film has been formed on the rear surface of the wafer W. However, the resist film may alternatively be formed on the front surface of the wafer W before the CF-type protective film is formed on the rear surface of the wafer W. In this case, again, the formation of the CF-type protective film and the formation of the resist film can be carried out separately from one another, and hence the CF-type protective film and the resist film can each be formed stably.

In the substrate processing system 83 described above, the CVD apparatus 84 forms a CF-type protective film by CVD processing. However, the protective film is not limited to being a CF-type protective film, but rather a protective film made of a photocurable resin may be formed instead. Moreover, the method of forming the protective film is not limited to being CVD processing, but rather any vapor deposition may be used, for example PVD (physical vapor deposition) processing.

The substrates subjected to the RIE processing in each of the above embodiments are not limited to being semiconductor wafers, but rather may instead be any of various substrates used in LCDs (liquid crystal displays), FPDs (flat panel displays) or the like, or photomasks, CD substrates, printed substrates, or the like.

Moreover, the curable resin in each of the above embodiments is of positive type, but may instead be of negative type.

It is to be understood that the present invention can also be attained by supplying to a system or apparatus a storage medium in which is stored a program code of software that realizes the functions of an embodiment as described above, and then causing a computer (or CPU, MPU, etc.) of the system or apparatus to read out and execute the program code stored in the storage medium.

In this case, the program code itself read out from the storage medium realizes the functions of the embodiment, and hence the program code and the storage medium in which the program code is stored constitute the present invention.

The storage medium used for supplying the program code may be, for example, a floppy (registered trademark) disk, a hard disk, a magnetic-optical disk, an optical disk such as a CD-ROM, a CD-R, a CD-RW, a DVD-ROM, a DVD-RAM, a DVD-RW or a DVD+RW, a magnetic tape, a nonvolatile memory card, or a ROM. Alternatively, the program code may be downloaded via a network.

Moreover, it is to be understood that the functions of the embodiment can be accomplished not only by executing a program code read out by the computer, but also by causing an OS (operating system) or the like which operates on the computer to perform a part or all of the actual operations based on instructions of the program code.

Furthermore, it is to be understood that the functions of the embodiment can also be accomplished by writing a program code read out from a storage medium into a memory provided on an expansion board inserted into the computer or in an expansion unit connected to the computer and then causing a CPU or the like provided on the expansion board or in the expansion unit to perform a part or all of the actual operations based on instructions of the program code.

What is claimed is:

1. A substrate processing method for a substrate processing system having at least an etching apparatus that carries out plasma etching processing on a substrate, the etching apparatus having therein an electrostatic chuck that electrostatically attracts the substrate and is adapted to contact a rear surface of the substrate, the method comprising:
 a first coating step of coating a rear surface of the substrate with curable resins;
 a curable resin curing step of curing the coated curable resins so as to form a resin protective film;
 an inverting step of inverting the substrate while holding a periphery of the substrate;
 a second coating step of coating a front surface of the substrate with resistant resins;
 a resistant resin curing step of curing the coated resistant resins;
 a resistant resin light exposure step of subjecting the cured resistant resins to light exposure processing;
 an etching step of carrying out the plasma etching processing on the front surface of the substrate; and
 a washing step of removing the cured curable resins and the coated resistant resins, wherein
 in said resistant resin light exposure step, the rear surface of the substrate is supported by pin-like projections such that the resin protective film is present between the rear surface of the substrate and the projections.

2. A substrate processing method as claimed in claim 1, wherein the curable resins are photocurable resins and are cured through irradiation with light.

3. A substrate processing method as claimed in claim 2, wherein:
 the resistant resin curing step of curing the coated resistant resins includes heating.

4. A substrate processing method as claimed in claim 2, wherein the photocurable resins comprise cellulose derivatives.

5. A substrate processing method as claimed in claim 1, wherein the curable resins are thermosetting resins and are cured by heating.

6. A substrate processing method as claimed in claim 5, wherein:
 the resistant resin curing step of curing the coated resistant resins includes heating.

7. A substrate processing method as claimed in claim 1, wherein:
 the resistant resin curing step of curing the coated resistant resins includes heating.

8. A non-transitory computer-readable storage medium storing a program for causing a computer to implement a substrate processing method for a substrate processing system having at least an etching apparatus that carries out plasma etching processing on a substrate, the etching apparatus having therein an electrostatic chuck that electrostatically attracts the substrate and is adapted to contact a rear surface of the substrate, the method comprising:
 a first coating step of coating a rear surface of the substrate with curable resins;
 a curable resin curing step of curing the coated curable resins so as to form a resin protective film;
 an inverting step of inverting the substrate while holding a periphery of the substrate;
 a second coating step of coating a front surface of the substrate with resistant resins;
 a resistant resin curing step of curing the coated resistant resins;
 a resistant resin light exposure step of subjecting the cured resistant resins to light exposure processing;
 an etching step of carrying out the plasma etching processing on the front surface of the substrate; and
 a washing step of removing the cured curable resins and the coated resistant resins
 wherein
 in said resistant resin light exposure step, the rear surface of the substrate is supported by pin-like projections such that the resin protective film is present between the rear surface of the substrate and the projections.

9. A non-transitory computer-readable storage medium as claimed in claim 8, wherein the curable resins are photocurable resins and are cured through irradiation with light.

10. A non-transitory computer-readable storage medium as claimed in claim 8, wherein the curable resins are thermosetting resins and are cured by heating.

11. A substrate processing method for a substrate processing system having at least an etching apparatus that carries out plasma etching processing on a substrate, the etching apparatus having therein an electrostatic chuck that electrostatically attracts the substrate and is adapted to contact a rear surface of the substrate, the method comprising:
 a resin protective film forming step of forming a resin protective film by sticking a resin sheet onto a rear surface of the substrate;
 an inverting step of inverting the substrate while holding a periphery of the substrate;
 a resistant resin film forming step of forming a resistant resin film onto a front surface of the substrate by using resistant resins;
 an etching step of carrying out the plasma etching processing on the front surface of the substrate; and
 a washing step of removing the resistant resins and the stuck resin sheet, wherein
 said resistant resin film forming step includes a resistant resin coating step of coating resistant resins onto the front surface of the substrate, a resistant resin curing step of curing the coated resistant resins and a resistant resin light exposure step of subjecting the cured resistant resins to light exposure processing, and
 in said resistant resin light exposure step, the rear surface of the substrate is supported by pin-like projections such that the resin protective film is present between the rear surface of the substrate and the projections.

12. A substrate processing method as claimed in claim 11, further comprising:
 a resistant resin curing step of curing the coated resistant resins by heating.

* * * * *

UNITED STATES PATENT AND TRADEMARK OFFICE
CERTIFICATE OF CORRECTION

| | | |
|---|---|---|
| PATENT NO. | : 7,985,699 B2 | Page 1 of 1 |
| APPLICATION NO. | : 11/689272 | |
| DATED | : July 26, 2011 | |
| INVENTOR(S) | : Nishimura | |

It is certified that error appears in the above-identified patent and that said Letters Patent is hereby corrected as shown below:

Title page, item (75), change "Narasaki (JP)" to --Nirasaki--.

Signed and Sealed this
Twenty-seventh Day of September, 2011

David J. Kappos
*Director of the United States Patent and Trademark Office*